(12) United States Patent
Pike

(10) Patent No.: US 6,174,632 B1
(45) Date of Patent: Jan. 16, 2001

(54) WAFER DEFECT DETECTION METHOD UTILIZING WAFER WITH DEVELOPMENT RESIDUE ATTRACTING AREA

(75) Inventor: Christopher Lee Pike, Fremont, CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/262,812

(22) Filed: Mar. 5, 1999

(51) Int. Cl.[7] ....................................................... G03F 9/00
(52) U.S. Cl. ............................. 430/30; 430/331; 382/149
(58) Field of Search ..................... 430/30, 331; 382/145, 382/149

(56) References Cited

U.S. PATENT DOCUMENTS 5,976,741 * 11/1999 Ziger et al. ............................. 430/30
5,985,497 * 11/1999 Phan et al. ............................. 430/30

* cited by examiner

Primary Examiner—Christopher G. Young
(74) Attorney, Agent, or Firm—Brinks Hofer Gilson & Lione

(57) ABSTRACT

A wafer defect detection method is disclosed that includes coating a wafer with a resist, then exposing a first section of the wafer, then developing the resist, and finally inspecting the wafer for defects. Since certain types of defects occur more often in areas with fewer structures, these defects can be better detected by exposing a significant area of the wafer without a reticle or with a reticle that contains few structures in a section of the wafer. Since different defects tend to occur depending on the structure, different inspection techniques can be used in those areas to better detect the defects.

20 Claims, 2 Drawing Sheets

WAFER DEFECT DETECTION METHOD UTILIZING WAFER WITH DEVELOPMENT RESIDUE ATTRACTING AREA

FIELD OF THE INVENTION

The present invention relates generally to monitoring wafer for defects. More specifically, it relates to using a monitor a wafer without a patterned reticle to detect certain types of process defects.

BACKGROUND OF THE INVENTION

A mask is a transparent, e.g. glass or quartz, plate covered with patterns used in making integrated circuits. Each pattern consists of opaque and transparent areas that define the size and shape of all circuit and device elements. The mask is used to expose selected areas of resist, which defines areas to be etched. The term reticle includes mask, especially a photomask, used in wafer fabrication.

A photoresist is a light-sensitive liquid that is spread as a uniform thin film on a wafer or substrate. After baking to solidify the liquid, exposure of specific patterns is performed using a photomask. Material remaining after development shields regions of the wafer from subsequent etch or implant operations.

Lithography is a process of transferring a pattern or image from one medium to another, as from a mask to a wafer. Photolithography is a lithographic technique involving light as the pattern transfer medium.

During the wafer fabrication process of solid state devices, such as a semiconductor, photomasks and reticles are used to form patterns for each layer of the devices on the wafer. Even an extremely small defect created during this process could greatly affect the production yield, circuits reliability or circuits functionality. For this reason, wafers are commonly inspected during each step of the fabrication process.

Some such defects are the result of development process. When resist is exposed, a chemical reaction occurs which results in various chemical by-products. Some of these by-products, residue, are not readily soluble in the developing solution and adhere to the wafer surface. Thus, they can be difficult to remove and they can create defects. Such by-products tend to adhere area of the wafer with relatively less patterns or no patterns.

Because of the possible presence of other types of defects, current in-line photo-track monitor processes result in a low signal to noise ratio for residue defects.

Currently monitor wafers are used to detect defects. These monitor wafers have known repetitious patterns at predetermined locations. These patterns are created using a mask/reticle. This method fails to detect certain types of defects, especially defects relating to the coat and develop portion of the cell. Of particular note, is the failure of this detection method to adequately detect post-develop residue defects. Such residue defects are caused by resist by-products that are not removed during the develop process. Such residue tends to adhere to the wafer surface predominantly in areas with the least amount of patterns, which can be on the substrate or an area of undeveloped resist. Since the repetitious patterns currently used for testing for defects contain patterns, the process is not sensitive to detecting defects such as post-develop residue defects. Also, analyzing a specific pattern for integrity takes a relatively longer amount of time.

A recognized problem, therefore, is detecting defects in the wafer development process, especially post-develop residue defects.

Another recognized problem is the length of time the defect detection process take when an analysis of a pattern must also be performed.

BRIEF SUMMARY OF THE INVENTION

The aforementioned problems are solved by providing a more sensitive method for detecting defects including post-develop residue defects. This method includes developing a portion of the wafer without a mask and using that area for defect detection.

BRIEF DESCRIPTION OF THE DRAWINGS

The present invention is described with reference to the accompanying figures. In the figures, like reference numbers indicate identical or functionally similar elements. Additionally, the left-most digit(s) of a reference number identifies the figure in which the reference number first appears.

DETAILED DESCRIPTION OF THE PREFERRED EMBODIMENT

Figure 1:
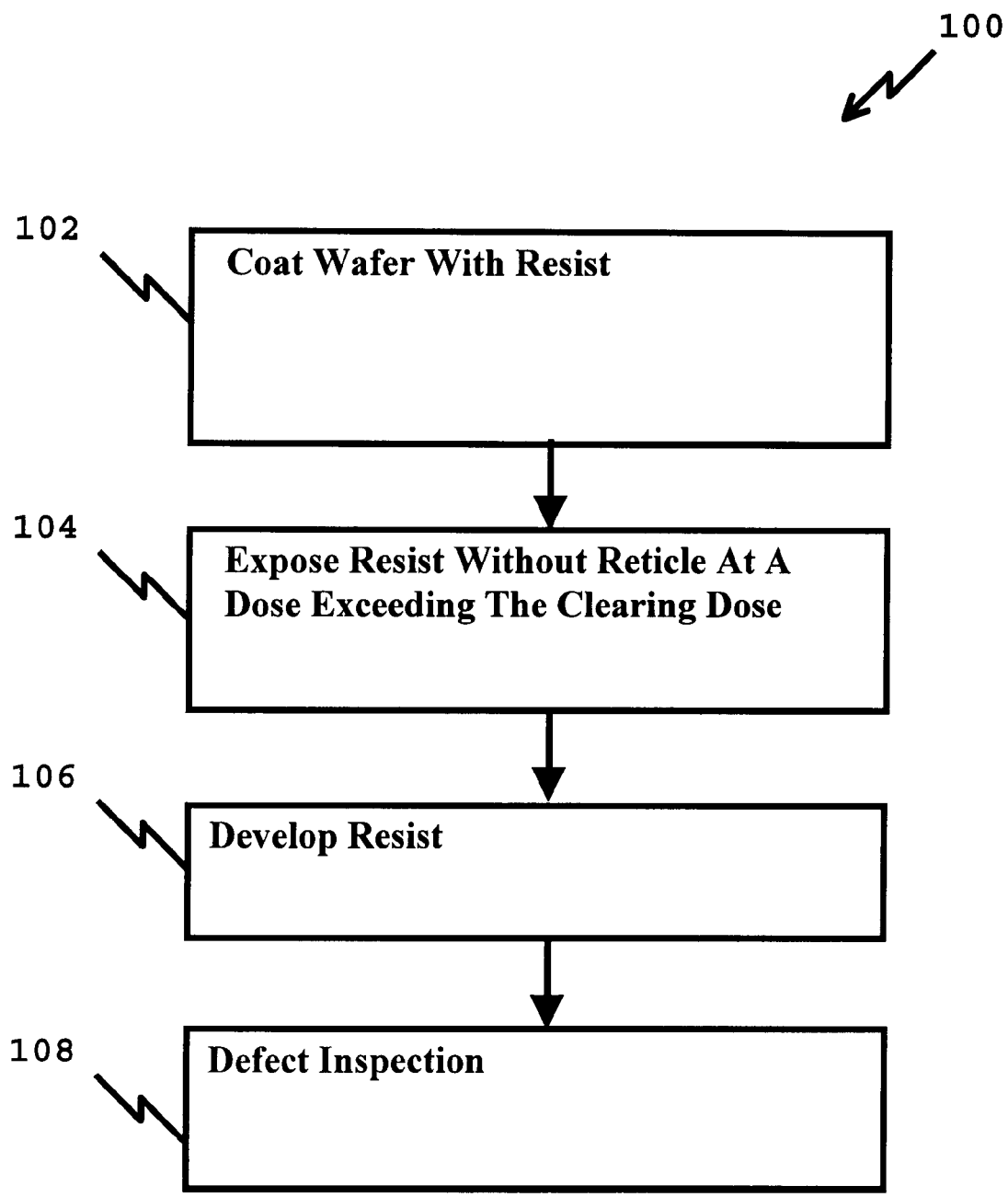
FIG. 1 is a flow diagram illustrating an embodiment of a portion of the method for detecting defect.

Referring to FIG. 1, a process 100 for detecting defects on a wafer is illustrated. Process 100 can be used in a variety of lithographic processes including photolithography, x-ray lithography, and others. Sub-steps such as hot plates, chill plates, and soft bakes can be part of this process but are not shown. The wafer may be for example silicon dioxide, metal film, or poly-silicon coated wafer.

At step 102, a wafer is coated with a resist, for example photoresist. Prior to step 102 the wafer has been properly prepared, including cleaning the wafer, UV cure, adhesion promoter, and pre-scan. The wafer can be coated with an anti-reflective coating (ARC) with or without a resist. Many lens type defects are caused by the ARC that is typically one tenth the thickness of the resist and is laid on top of the resist.

At step 104 the wafer is exposed without a reticle at a dose that exceeds the clearing dose to fully exposes the resist. This step can include such sub-steps as soft bakes and reticle alignment. The entire wafer can be exposed without a reticle or merely a portion of the wafer can be so exposed. By fully exposing the resist without a mask, the amount of resist by-product is maximized. Additionally, since the residue predominantly deposits in areas with fewer patterns, the available area for the residue to be deposited is increased. Alternatively, a reticle without a pattern can be used. In the first case, the entire wafer is a control wafer. In the later case, only a portion of the wafer is used for testing. If a reticle is used, then alignment structures can be created outside the area of interest to aid in the alignment of the wafer during fabrication and defect detection.

At step 106, the resist is developed. This step can include such sub-steps as hardbakes.

At step 108, the wafer is inspected for defects. Such defects include postdevelopment residue defects. Step 108 is performed before the resist is removed.

The process 100 provides a significantly greater surface area on the wafer where the residue can adhere because there are fewer or no structures on the wafer.

Thus, the signal to noise ratio for detecting defects is increased. This allows for more sensitive monitoring of the process parameters, resulting in the ability to better adjust the process parameters.

Because of the reduced signal to noise ratio, defect detection of lens type defects can also be performed at a greater sensitivity than with conventional methods. The signal to noise ratio is reduced because without any pattern structures on the wafer any defect that creates a structure will be more easily detected.

Additionally, process 100 allows for inspecting a wafer without the need to inspect pattern integrity. Thus, the inspection process is faster resulting in lower manufacturing costs.

Figure 2:
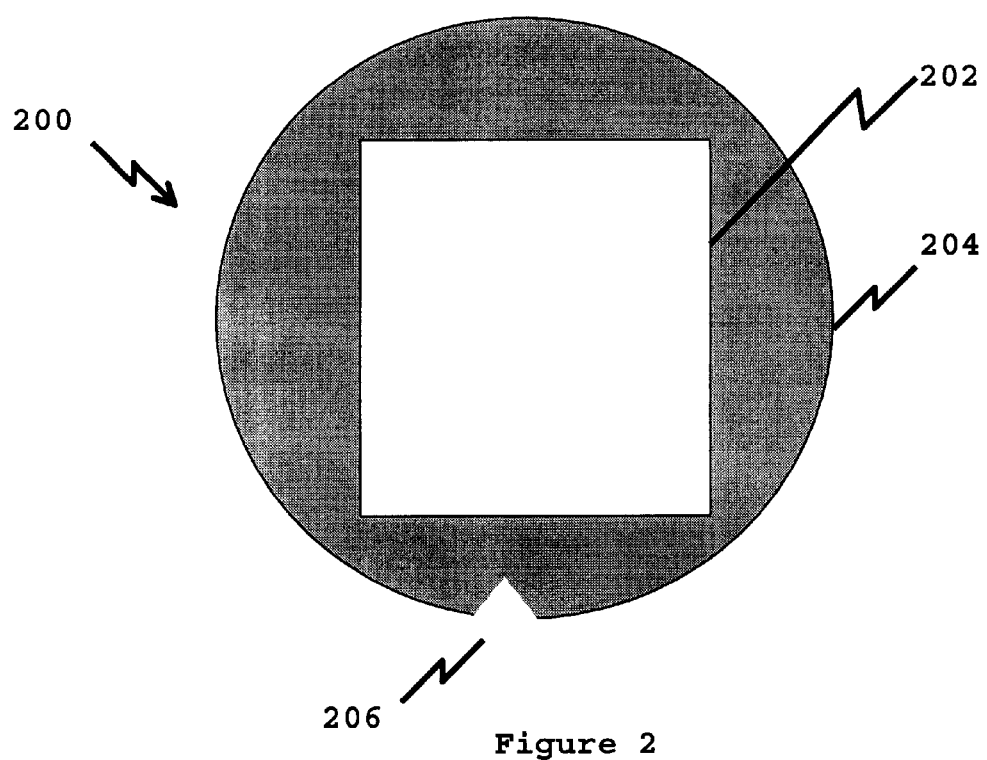
FIG. 2 is a diagram illustrating a wafer with a first and second sections.

Referring to FIG. 2, a wafer 200 used in the process illustrated in FIG. 1 is shown. The wafer 200 is generally divided into two sections, a first section 202 and a second section 204. The size, shape, and proportions of sections 202 and 204 can be varied. For example, Section 202 can be 5%, 10%, 30%, or up to 100% of the entire wafer surface area. A notch 206 is used to physically align the wafer during processing. Other alignment mechanisms can also be used in conjunction with the notch 206 or in place of the notch 206.

Section 202 is the exposed resist area and contains no pattern because no pattern was used in the reticle that corresponds to that area. Also, an area of section 202 can be left unexposed and used to determine if splashing occurred during the development step.

Section 204 has resist applied to it in step 102 (FIG. 1).

Figure 3:
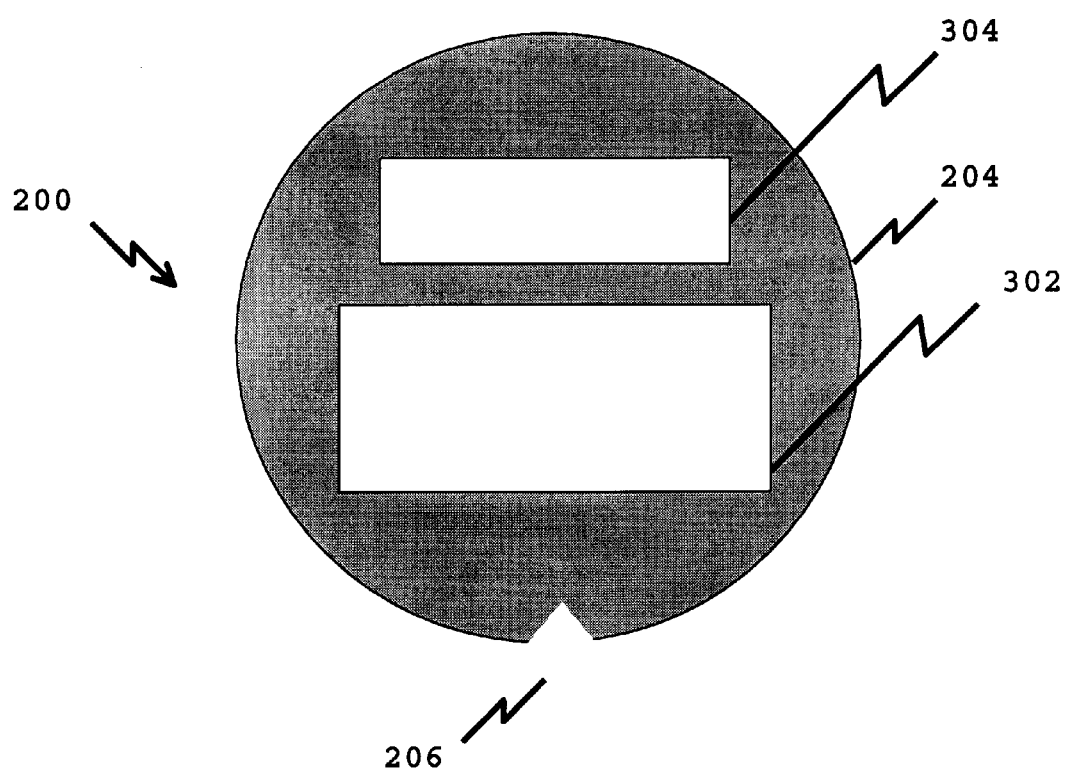
FIG. 3 is a diagram illustrating a wafer with a first and second sections, the first section including two subsections.

Referring to FIG. 3, the first section 202 (FIG. 2) includes two subsection 304 and 302. The number, size, and shape of these subsections is for illustration purposes. Various sizes and shapes can be used and the number of subsections can be varied. However, it is desirable to have the subsections of such a configuration that they cover a significant portion of the wafer without having too complex of a configuration. That is, regular shapes, such as circles, squares, ovals, pentagons, etc., results in superior defect detection then complex, irregular shaped subsections.

While preferred embodiments have been shown and described, it will be understood that they are not intended to limit the disclosure, but rather it is intended to cover all modifications and alternative methods and apparatuses falling within the spirit and scope of the invention as defined in the appended claims or their equivalents.

What is claimed is:

1. A wafer defect detection method comprising:
   (a) coating the wafer with a resist, the wafer having first and second sections;
   (b) exposing the first section of the wafer, the first section being a continuous region, which is free of any pattern, covering at least five percent of the wafer's surface area, wherein the first section provides an area to attract development residue;
   (c) developing substantially all of the resist in the first and second sections; and
   (d) inspecting the wafer for defects.

2. The method as recited in claim 1, wherein the first section of the wafer is at least approximately thirty percent of the wafer.

3. The method as recited in claim 1, wherein the first section of the wafer is approximately the entire wafer.

4. The method as recited in claim 1, wherein a second section of the wafer contains an area left unexposed for use in detecting residue in the unexposed resist.

5. The method as recited in claim 1, wherein the resist is photoresist.

6. The method as recited in claim 1, wherein the inspecting of the wafer for defects includes inspecting for a post-develop residue type defect.

7. The method as recited in claim 1, wherein (b) includes exposing the first section of the wafer with a blank reticle.

8. The method as recited in claim 1, wherein the inspecting of the wafer for defects includes inspecting for a lens type defect.

9. The method as recited in claim 1, wherein (d) includes inspecting for defects only in the first and second subsections.

10. The method as recited in claim 1, wherein (d) includes inspecting for a first type of defect in the first and second subsections and inspecting for a second type of defect outside the first and second subsections.

11. A wafer defect detection method comprising:
    (a) coating a wafer with a resist, the wafer having first and second sections;
    (b) exposing the first section of the wafer, the first section covering at least five percent of the wafer's surface area; wherein the first section having a first subsection and a second subsection, the first and second subsections being non-continuous, the first subsection being a continuous region, which is free of any pattern, wherein the first subsection provides an area to attract residue;
    (c) developing substantially all the resist in the first section; and
    (d) inspecting the wafer for defects.

12. The method as recited in claim 11, wherein the first section of the wafer is at least approximately thirty percent of the wafer.

13. The method as recited in claim 11, wherein the first section of the wafer is substantially all of the wafer.

14. The method as recited in claim 11, wherein the resist is photoresist.

15. The method as recited in claim 11, wherein the inspecting of the wafer for defects includes inspecting for a post-develop residue type defect.

16. The method as recited in claim 11, wherein (b) includes exposing the first section of the wafer with a blank reticle.

17. The method as recited in claim 11, wherein the inspecting of the wafer for defects includes inspecting for a lens type defect.

18. The method as recited in claim 11, wherein (b) includes exposing the wafer with a reticle that is blank in a region corresponding the first and second subsections and contains alignment structure outside the first and second subsections.

19. The method as recited in claim 11, wherein (d) includes inspecting for defects only in the first and second subsections.

20. The method as recited in claim 11, wherein (d) includes inspecting for a first type of defect in the first and second subsections and inspecting for a second type of defect outside the first and second subsections.

* * * * *